US010508338B2

(12) United States Patent
Matsumoto et al.

(10) Patent No.: US 10,508,338 B2
(45) Date of Patent: Dec. 17, 2019

(54) DEVICE FOR ATOMIC LAYER DEPOSITION

(71) Applicant: THE JAPAN STEEL WORKS, LTD., Shinagawa-ku, Tokyo (JP)

(72) Inventors: Tatsuya Matsumoto, Kanagawa (JP); Keisuke Washio, Kanagawa (JP)

(73) Assignee: THE JAPAN STEEL WORKS, LTD., Tokyo (JP)

( * ) Notice: Subject to any disclaimer, the term of this patent is extended or adjusted under 35 U.S.C. 154(b) by 220 days.

(21) Appl. No.: 15/575,357

(22) PCT Filed: Apr. 19, 2016

(86) PCT No.: PCT/JP2016/062399
§ 371 (c)(1),
(2) Date: Nov. 18, 2017

(87) PCT Pub. No.: WO2016/190004
PCT Pub. Date: Dec. 1, 2016

(65) Prior Publication Data
US 2018/0155833 A1 Jun. 7, 2018

(30) Foreign Application Priority Data

May 26, 2015 (JP) .................. 2015-106855

(51) Int. Cl.
C23C 16/40 (2006.01)
C23C 16/455 (2006.01)
(Continued)

(52) U.S. Cl.
CPC ...... C23C 16/45544 (2013.01); C23C 16/308 (2013.01); C23C 16/4401 (2013.01);
(Continued)

(58) Field of Classification Search
CPC .......... C23C 16/45544; C23C 16/4401; C23C 16/4412; C23C 16/45502;
(Continued)

(56) References Cited

U.S. PATENT DOCUMENTS 5,222,074 A * 6/1993 Uchiyama ............... C23C 14/24
118/719
5,326,725 A 7/1994 Sherstinsky et al.
(Continued)

FOREIGN PATENT DOCUMENTS

CN 101356630 A 1/2009
JP 61163279 A 7/1986
(Continued)

OTHER PUBLICATIONS

International Search Report (ISR) and Written Opinion dated Aug. 2, 2016 issued in International Application No. PCT/JP2016/062399.

(Continued)

Primary Examiner — Rudy Zervigon
(74) Attorney, Agent, or Firm — Holtz, Holtz & Volek PC

(57) ABSTRACT

A device for atomic layer deposition includes: an injector installed to an opening of a film deposition chamber; and an injector adhesion preventive member installed by insertion into the opening, wherein the injector includes an injector raw material gas supply path, an injector reactant gas supply path, and an injector inert gas supply path, the respective paths being partitioned from each other, the injector adhesion preventive member includes an adhesion preventive member raw material gas supply path, an adhesion preventive member reactant gas supply path, and an adhesion preventive member inert gas supply path, the respective paths being partitioned from each other, and the adhesion preventive member inert gas supply path is provided such (Continued)

that the inert gas flows in a clearance between an outer peripheral side of the injector adhesion preventive member and an inner peripheral side of the opening.

16 Claims, 5 Drawing Sheets

(51) Int. Cl.
*C23C 16/30* (2006.01)
*C23C 16/44* (2006.01)
*C23C 16/458* (2006.01)

(52) U.S. Cl.
CPC ........ *C23C 16/455* (2013.01); *C23C 16/4586* (2013.01); *C23C 16/45504* (2013.01); *C23C 16/45542* (2013.01)

(58) Field of Classification Search
CPC .......... C23C 16/45536; C23C 16/4586; C23C 16/45542; C23C 16/308; C23C 16/45504; C23C 16/455
USPC ................. 118/715; 156/345.33, 345.34
See application file for complete search history.

(56) References Cited

U.S. PATENT DOCUMENTS

| | | | | |
|---|---|---|---|---|
| 5,338,363 | A * | 8/1994 | Kawata | C23C 16/45512 118/715 |
| 5,405,446 | A * | 4/1995 | Nakajima | C23C 16/45504 118/715 |
| 5,457,298 | A * | 10/1995 | Nelson | H01J 37/32082 156/345.46 |
| 5,534,073 | A * | 7/1996 | Kinoshita | B25B 11/005 118/728 |
| 5,567,243 | A * | 10/1996 | Foster | C23C 16/04 118/730 |
| 5,578,132 | A * | 11/1996 | Yamaga | C23C 16/4404 118/715 |
| 5,632,820 | A * | 5/1997 | Taniyama | C23C 16/4401 118/715 |
| 5,643,394 | A * | 7/1997 | Maydan | C23C 16/45574 118/723 E |
| 5,916,455 | A * | 6/1999 | Kumagai | H01J 37/321 118/723 I |
| 5,922,100 | A * | 7/1999 | Cain | C03B 19/1423 118/724 |
| 5,935,283 | A * | 8/1999 | Sweeney | B01D 45/00 261/112.1 |
| 5,972,116 | A | 10/1999 | Takagi | |
| 5,992,463 | A * | 11/1999 | Redemann | C23C 16/44 137/240 |
| 5,997,651 | A | 12/1999 | Matsuse et al. | |
| 6,200,389 | B1 * | 3/2001 | Miller | C03C 17/002 118/715 |
| 6,248,672 | B1 | 6/2001 | Takagi | |
| 6,293,310 | B1 * | 9/2001 | Redemann | C23C 16/44 137/884 |
| 6,410,102 | B1 * | 6/2002 | Hashizume | C23C 16/4405 118/723 E |
| 6,733,593 | B1 | 5/2004 | Tanaka et al. | |
| 7,354,622 | B2 * | 4/2008 | Shinriki | C23C 16/452 427/252 |
| 7,635,501 | B2 * | 12/2009 | Komai | C23C 16/4412 118/50 |
| 8,454,749 | B2 * | 6/2013 | Li | C23C 16/4401 118/715 |
| 8,506,713 | B2 * | 8/2013 | Takagi | C23C 16/409 118/715 |
| 8,539,908 | B2 * | 9/2013 | Takagi | C23C 16/45521 118/696 |
| 8,764,902 | B2 * | 7/2014 | Suzuki | C23C 16/45565 118/715 |
| 8,851,886 | B2 * | 10/2014 | Morita | C23C 16/4401 118/724 |
| 9,540,731 | B2 * | 1/2017 | Noorbakhsh | C23C 16/45565 |
| 9,767,993 | B2 * | 9/2017 | Ishibashi | C23C 16/45563 |
| 9,988,717 | B2 * | 6/2018 | Honma | C23C 16/45548 |
| 10,167,557 | B2 * | 1/2019 | Hawkins | C23C 16/52 |
| 2002/0023589 | A1 * | 2/2002 | Kondo | H01J 37/32082 118/723 ER |
| 2002/0108711 | A1 * | 8/2002 | Kim | C23C 16/45565 156/345.33 |
| 2002/0168854 | A1 * | 11/2002 | Tometsuka | C23C 16/4409 438/680 |
| 2003/0041802 | A1 * | 3/2003 | Tanaka | C23C 16/4412 118/715 |
| 2003/0124842 | A1 * | 7/2003 | Hytros | C23C 16/34 438/680 |
| 2003/0132319 | A1 * | 7/2003 | Hytros | C23C 16/455 239/548 |
| 2003/0136365 | A1 * | 7/2003 | Komai | C23C 16/4412 123/142.5 R |
| 2004/0154537 | A1 * | 8/2004 | Chon | C30B 25/08 118/715 |
| 2005/0061442 | A1 * | 3/2005 | Higashiura | H01J 37/32082 156/345.44 |
| 2006/0021574 | A1 * | 2/2006 | Armour | C23C 16/45565 118/715 |
| 2006/0096540 | A1 * | 5/2006 | Choi | C23C 16/45574 118/724 |
| 2006/0174833 | A1 * | 8/2006 | Yamazaki | H01L 21/3144 118/719 |
| 2006/0225655 | A1 * | 10/2006 | Faguet | C23C 16/4401 118/723 R |
| 2006/0280868 | A1 | 12/2006 | Kato et al. | |
| 2007/0022954 | A1 * | 2/2007 | Iizuka | C23C 16/455 118/724 |
| 2007/0095284 | A1 * | 5/2007 | Iizuka | C23C 16/45565 118/715 |
| 2007/0158026 | A1 * | 7/2007 | Amikura | C23C 16/455 156/345.34 |
| 2008/0173366 | A1 * | 7/2008 | Kwon | C23C 16/455 137/884 |
| 2008/0206987 | A1 * | 8/2008 | Gelatos | C23C 16/14 438/654 |
| 2009/0038548 | A1 * | 2/2009 | Iizuka | C23C 16/409 118/724 |
| 2009/0173444 | A1 * | 7/2009 | Sago | C23C 16/45565 156/345.33 |
| 2009/0250008 | A1 * | 10/2009 | Matsushima | C23C 16/401 118/728 |
| 2009/0277389 | A1 | 11/2009 | Kakimoto | |
| 2010/0186673 | A1 * | 7/2010 | Tanaka | B23K 20/08 118/726 |
| 2010/0272895 | A1 * | 10/2010 | Tsuda | C23C 16/409 427/255.32 |
| 2011/0036291 | A1 * | 2/2011 | Jauhiainen | C23C 16/45544 118/715 |
| 2011/0212625 | A1 * | 9/2011 | Toyoda | C23C 16/4412 438/758 |
| 2011/0303147 | A1 | 12/2011 | Tachibana et al. | |
| 2011/0305836 | A1 | 12/2011 | Murata et al. | |
| 2012/0031748 | A1 | 2/2012 | Ishihara | |
| 2014/0083615 | A1 * | 3/2014 | Kim | H01J 37/3211 156/345.37 |
| 2014/0090599 | A1 * | 4/2014 | Saitou | B05B 1/005 118/728 |
| 2014/0209015 | A1 * | 7/2014 | Yamada | C30B 25/12 117/98 |
| 2014/0239091 | A1 * | 8/2014 | Huang | C23C 16/4401 239/128 |
| 2014/0262034 | A1 * | 9/2014 | Ishibashi | C23C 16/45563 156/345.29 |
| 2015/0004798 | A1 * | 1/2015 | Chandrasekharan | H01L 21/67017 438/758 |
| 2015/0024609 | A1 * | 1/2015 | Milligan | H01L 21/67069 438/798 |

(56) References Cited

U.S. PATENT DOCUMENTS

| | | | | |
|---|---|---|---|---|
| 2015/0267299 | A1* | 9/2015 | Hawkins | C23C 16/52 |
| | | | | 427/255.28 |
| 2017/0101710 | A1* | 4/2017 | Chandrasekharan | |
| | | | | C23C 16/45519 |
| 2018/0148837 | A1* | 5/2018 | Matsumoto | C23C 16/4401 |
| 2018/0148842 | A1* | 5/2018 | Matsumoto | C23C 16/50 |
| 2018/0155833 | A1* | 6/2018 | Matsumoto | C23C 16/44 |
| 2019/0048463 | A1* | 2/2019 | Toramaru | C23C 16/4405 |
| 2019/0177842 | A1* | 6/2019 | Washio | C23C 16/44 |
| 2019/0211448 | A1* | 7/2019 | Washio | C23C 16/44 |

FOREIGN PATENT DOCUMENTS

| | | |
|---|---|---|
| JP | 63076880 A | 4/1988 |
| JP | 01183113 A | 7/1989 |
| JP | 06140379 A | 5/1994 |
| JP | 07201754 A | 8/1995 |
| JP | 08186081 A | 7/1996 |
| JP | 09115993 A | 5/1997 |
| JP | 11335849 A | 12/1999 |
| JP | 2000208439 A | 7/2000 |
| JP | 2000243711 A | 9/2000 |
| JP | 2002302770 A | 10/2002 |
| JP | 2003068657 A | 3/2003 |
| JP | 2004339581 A | 12/2004 |
| JP | 2006080148 A | 3/2006 |
| JP | 2006351655 A | 12/2006 |
| JP | 2007281150 A | 10/2007 |
| JP | 2009062579 A | 3/2009 |
| JP | 2010212433 A | 9/2010 |
| JP | 2010212434 A | 9/2010 |
| JP | 2012052221 A | 3/2012 |
| JP | 2012126977 A | 7/2012 |
| JP | 2012175055 A | 9/2012 |
| JP | 2014192379 A | 10/2014 |
| JP | 2015073019 A | 4/2015 |
| JP | 2015073020 A | 4/2015 |
| JP | 2015073021 A | 4/2015 |
| KR | 1020080098687 A | 11/2008 |
| KR | 101028605 B1 | 4/2011 |
| TW | 457524 B | 10/2001 |
| WO | 0042235 A1 | 7/2000 |
| WO | 2007116940 A1 | 10/2007 |

OTHER PUBLICATIONS

English translation of the International Preliminary Report on Patentability dated Dec. 7, 2017 issued in counterpart International Application No. PCT/JP2016/062399.

Related U.S. Appl. No. 15/575,358; First Named Inventor: Tatsuya Matsumoto; Title: "Device for Atomic Layer Deposition"; filed, Nov. 18, 2017.

Related U.S. Appl. No. 15/575,359; First Named Inventor: Tatsuya Matsumoto; Title: "Atomic Layer Growth Device and Atomic Layer Growth Device Exhaust Unit"; filed, Nov. 18, 2017.

Related U.S. Appl. No. 15/575,360; First Named Inventor: Tatsuya Matsumoto; Title: Apparatus for Plasma Atomic Layer Deposition; filed, Nov. 18, 2017.

\* cited by examiner

DEVICE FOR ATOMIC LAYER DEPOSITION

TECHNICAL FIELD

The present invention relates to a device for atomic layer deposition that forms a thin film on a substrate.

BACKGROUND ART

An atomic layer deposition method is a method for alternately supplying, on a substrate, gases of elements constituting a thin film to be formed to form the thin film on the substrate in units of atomic layers, and is known as a technology for uniformly forming a thin film.

The atomic layer deposition method is excellent in step coverage and film thickness controllability, compared to a general CVD (Chemical Vapor Deposition) method.

When formation of a thin film is repeatedly performed by the atomic layer deposition method, the thin film is adhered also on an inner surface of a film deposition chamber. When the thickness of the thin film adhered on the inner surface of the film deposition chamber is increased, the deposited thin film is peeled off, and a part of the thin film becomes particles, which causes deterioration of the quality of the thin film formed on the substrate. Therefore, the thin film adhered on the inner surface of the film deposition chamber is preferably removed regularly.

Examples of a cleaning method for a film deposition chamber include a wet etching method and a gas etching method. In the wet etching method, the thin film adhered on the inner surface of the film deposition chamber is removed by liquid such as hydrofluoric acid, for example. On the other hand, in the gas etching method, etching gas is supplied to the inside of the film deposition chamber, so that the thin film adhered on the inner surface of the film deposition chamber is removed.

Additionally, a device using an adhesion preventive plate in CVD film deposition or sputtering film deposition (refer to Patent Literature 1), and a vapor phase growth device that suppresses generation of gas from deposits deposited on an inner wall of a chamber by covering the deposits deposited on the inner wall of the chamber with an amorphous film are known (refer to Patent Literature 2).

Furthermore, a device that purges nitrogen gas into a space generated in a clearance between an injector for supplying gas and a film deposition device, to avoid film adhesion to an injector insertion hole for installing the injector is proposed (refer to Patent Literature 3).

CITATION LIST

Patent Literature

Patent Literature 1
  Japanese Patent Laid-Open No. 11-335849
Patent Literature 2
  Japanese Patent Laid-Open No. 2006-351655
Patent Literature 3
  Japanese Patent Laid-Open No. 2012-175055

SUMMARY OF INVENTION

Technical Problem

When the adhesion preventive plate of Patent Literature 1 is used, maintenance by wet etching of an injector is facilitated. However, in the CVD film deposition, or the sputtering film deposition, step coverage of a film is small, and therefore movement of the film to a back side of an adhesion preventive plate can be ignored. However, in the atomic layer deposition method, the step coverage of the film is large, and therefore raw material gas and reactant gas are moved into a clearance between the adhesion preventive plate and the injector. Therefore, it is difficult to avoid film adhesion to the injector with only a general adhesion preventive plate. Additionally, when a film adhesion amount is increased, the adhered film becomes a particle source, and therefore maintenance of the injector and the device regularly needs to be performed similarly to the adhesion preventive plate.

According to the device of Patent Literature 2, reduction in the frequency of cleaning is possible. However, in a case where the thickness of the deposits deposited on the inner wall of the chamber and the amorphous film covering the deposits becomes a predetermined thickness or more, cleaning needs to be performed by using the wet etching method. In the wet etching method, the film deposition chamber is opened, and therefore as the size of the film deposition chamber is increased, time and labor of opening work are increased. Accordingly, in a case where the gas etching method can be used, the gas etching method is preferably used. However, while an adhered portion of the thin film on an inner wall surface of the film deposition chamber needs to be heated to a predetermined temperature or more in order to perform etching by the gas etching method, a portion separated from a heater does not reach a required heating temperature, and it becomes difficult to perform gas etching. Therefore, in a case where a certain amount of the thin film is adhered at a place where gas etching is unlikely to be performed, wet etching needs to be performed by opening the film deposition chamber.

Furthermore, according to the device of Patent Literature 3, nitrogen gas is purged into the space generated in the clearance between the injector and the device, so that it is possible to avoid film adhesion to the injector insertion hole for installing the injector. However, both raw material gas and reactant gas cause reaction near a film deposition chamber where the raw material gas and the reactant gas are mixed, and therefore it is impossible to avoid film adhesion and generation of particles inside the injector. Accordingly, the injector needs to be replaced each time periodical maintenance is performed. Generally, the injector is connected to a large number of pipes made of stainless steel such as raw material gas pipes, reactant gas pipes, and purge gas pipes, and therefore the injector cannot be easily detached, and the injector needs to be made maintenance-free.

The invention of this application has been made in view of the above circumstances as a background, and an object of the invention is to provide a device for atomic layer deposition that is excellent in maintainability.

Solution to Problem

That is, in a device for atomic layer deposition of the present invention, a first aspect of the present invention is a device for atomic layer deposition including: a film deposition chamber; an injector that is installabel to an opening of the film deposition chamber; and an injector adhesion preventive member that is installabel by insertion into the opening so as to be located on an inside of the film deposition chamber than the injector, wherein the injector includes: an injector raw material gas supply path for supplying raw material gas as a raw material of a thin film, and an injector raw material gas supply port that is provided in the injector raw material gas supply path that the raw material gas flows out; an injector reactant gas supply path for supplying reactant gas which reacts with the raw material gas to form the thin film, and an injector reactant gas supply port that is provided in the injector reactant gas supply path that the reactant gas flows out; and an injector inert gas supply path that an inert gas flows, and an injector inert gas supply port that is provided in the injector inert gas supply path that the inert gas flows out, the respective paths and ports being partitioned from each other, the injector adhesion preventive member includes: an adhesion preventive member raw material gas supply path that is continued to the injector raw material gas supply port to supply the raw material gas, and an adhesion preventive member raw material gas supply port that is provided in the adhesion preventive member raw material gas supply path that the raw material gas flows out to the inside of the film deposition chamber; an adhesion preventive member reactant gas supply path that is continued to the injector reactant gas supply port to supply the reactant gas, and an adhesion preventive member reactant gas supply port that is provided in the adhesion preventive member reactant gas supply path that the reactant gas flows out to the inside of the film deposition chamber; and an adhesion preventive member inert gas supply path that is continued to the injector inert gas supply port to send the inert gas, and an adhesion preventive member inert gas supply port that is provided in the adhesion preventive member inert gas supply path that the inert gas flows out to the inside of the film deposition chamber, the respective paths and ports being partitioned from each other, and the adhesion preventive member inert gas supply path is provided such that the inert gas flows in a clearance between an outer peripheral side of the injector adhesion preventive member and an inner peripheral side of the opening.

According to a device for atomic layer deposition of a second aspect of the present invention, in the above present invention, in the injector and the injector adhesion preventive member, sealing members are disposed in at least such positions as to partition the raw material gas and the reactant gas, between members that communicate the injector raw material gas supply path with the adhesion preventive member raw material gas supply path through the injector raw material gas supply port, and between members that communicate the injector reactant gas supply path with the adhesion preventive member reactant gas supply path through the injector reactant gas supply port.

According to a device for atomic layer deposition of a third aspect of the present invention, in the above present invention, a leading end of the injector and a leading end of the injector adhesion preventive member are disposed so as to abut on each other, and the sealing members are pressed in a state where the injector adhesion preventive member is installed to the film deposition chamber.

According to a device for atomic layer deposition of a fourth aspect of the present invention, in the above present invention, the sealing members are O-rings.

According to a device for atomic layer deposition of a fifth aspect of the present invention, in the above present invention, in the injector adhesion preventive member, an O-ring groove that stores a part of a sectional shape of the O-ring is formed.

According to a device for atomic layer deposition of a sixth aspect of the present invention, in the above present invention, a sealing member is disposed on a contact surface of the film deposition chamber and the injector.

According to a device for atomic layer deposition of a seventh aspect of the present invention, in the above present invention, the adhesion preventive member inert gas supply path is formed by a space between an outer wall of the injector adhesion preventive member and an inside of an inner wall of the opening.

According to a device for atomic layer deposition of an eighth aspect of the present invention, in the above present invention, the injector adhesion preventive member has a flange whose size exceeds a size of the opening on a side of the film deposition chamber, the flange has a clearance between the inner wall of the film deposition chamber adjacent to the opening and the flange, and the clearance is provided with the adhesion preventive member inert gas supply port.

According to a device for atomic layer deposition of a ninth aspect of the present invention, in the above present invention, a size of the clearance is 10 mm or less.

According to a device for atomic layer deposition of a tenth aspect of the present invention, in the above present invention, the flange is installe to the film deposition chamber by a installeing member capable of adjusting the clearance.

According to a device for atomic layer deposition of an eleventh aspect of the present invention, in the above present invention, the opening is formed in a tubular hole shape, and the injector raw material gas supply path and the injector reactant gas supply path located on at least a side of the film deposition chamber of the injector, and the adhesion preventive member raw material gas supply path and the adhesion preventive member reactant gas supply path of the injector adhesion preventive member, are formed along an axial direction of the opening.

According to a device for atomic layer deposition of a twelfth aspect of the present invention, in the above present invention, the device for atomic layer deposition has respective purge gas supply paths that purges the raw material gas and the reactant gas.

According to a device for atomic layer deposition of a thirteenth aspect of the present invention, in the above present invention, the purge gas supply path that purges the raw material gas that sreves something as an injector raw material gas supply path and an adhesion preventive member raw material gas supply path, and the purge gas supply path that purges the reactant gas that serves somthing as an injector reactant gas supply path and an adhesion preventive member reactant gas supply path.

According to a device for atomic layer deposition of a fourteenth aspect of the present invention, in the above present invention, the adhesion preventive member inert gas supply path is formed as an annular flow path in at least an end on a side of the film deposition chamber, and the injector inert gas supply path has a plurality of linear flow paths toward the film deposition chamber, and is communicated with the annular flow path.

According to a device for atomic layer deposition of a fifteenth aspect of the present invention, in the above present invention, the adhesion preventive member raw material gas supply port and the adhesion preventive member reactant gas supply port are located on a side of the injector than an inner end surface of the adhesion preventive member on a side of the film deposition chamber.

Advantageous Effects of Invention

According to the present invention, an injector adhesion preventive member can be easily removed from a side of a film deposition chamber, and it is possible to suppress film adhesion to an injector and a vicinity of the injector adhesion preventive member, and therefore it is possible to reduce the frequency of cleaning of the injector and an injector insertion hole for installing the injector to improve maintenance workability.

BRIEF DESCRIPTION OF DRAWINGS

FIG. 2 FIG. 2A is an enlarged view of an injector and an injector adhesion preventive member illustrated in FIG. 1.

FIG. 3 FIG. 3A illustrates the injector illustrated in FIG. 1.

FIG. 5 FIG. 5A, FIG. 5B, FIG. 5C, and FIG. 5D each are a view illustrating a process of forming a thin film on a substrate similarly.

DESCRIPTION OF EMBODIMENT

First, a configuration of a device for atomic layer deposition of this embodiment will be described with reference to FIG. 1.

Figure 1:
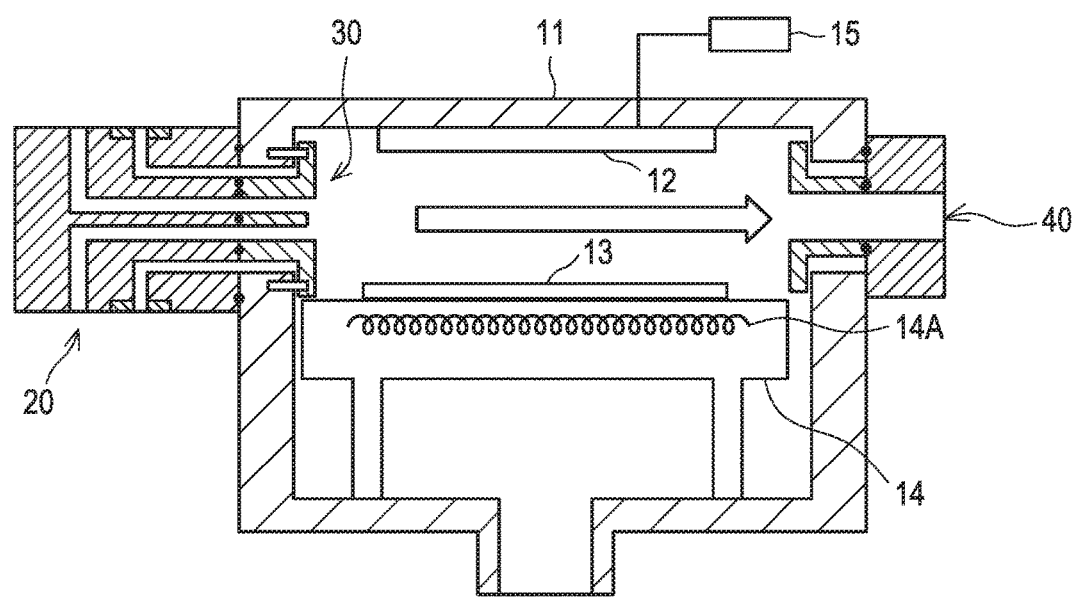
FIG. 1 A schematic configuration diagram illustrating a device for atomic layer deposition of an embodiment of the present invention.

FIG. 1 is a schematic configuration diagram illustrating an example of the device for atomic layer deposition of this embodiment.

A device for atomic layer deposition 10 of this embodiment alternately supplies raw material gas and reactant gas to form a thin film on a substrate 13 in units of atomic layers. At this time, the substrate 13 can be heated in order to enhance reaction activity. Particularly, TMA (Tri-Methyl Aluminum) is used as the raw material gas in this embodiment, and at this time, plasma can be generated in order to enhance reaction activity. Although parallel plate electrodes are used for generation of plasma in this embodiment, the present invention is not limited to this scheme.

A film deposition chamber 11 includes an injector 20, an injector adhesion preventive member 30 located on the inside of the film deposition chamber 11 with respect to the injector 20, an exhaust section 40, a stage 14 having a heater 14A, an upper electrode 12, and a high frequency power supply 15. The temperature of the substrate 13 can be adjusted by the heater 14A. For example, in a case of plasma ALD, the substrate 13 can be heated to 50 to 200 C.

The upper electrode 12 is provided so as to be located above the substrate 13 installed on the stage 14, and is connected to the high frequency power supply 15. The high frequency power supply 15 supplies a high-frequency current of a predetermined frequency, so that plasma is generated between the upper electrode 12 and the stage 14.

Figure 2A:
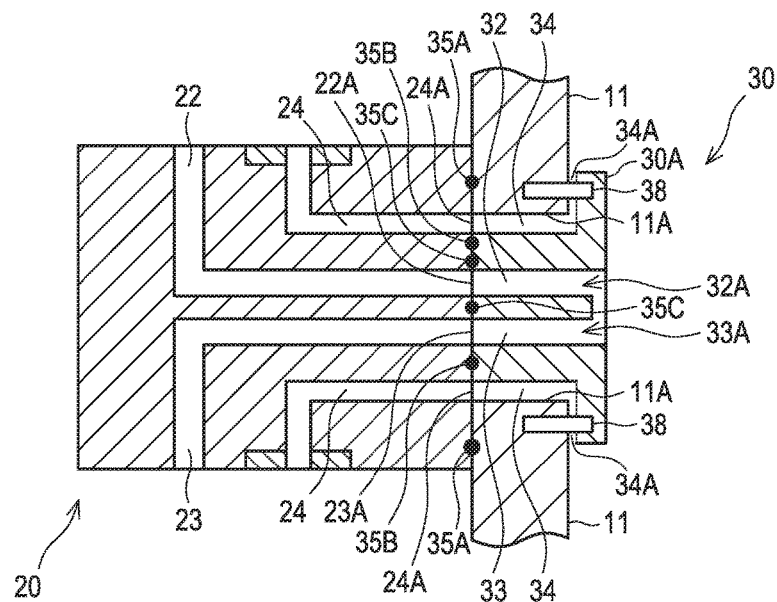
Figure 2B:
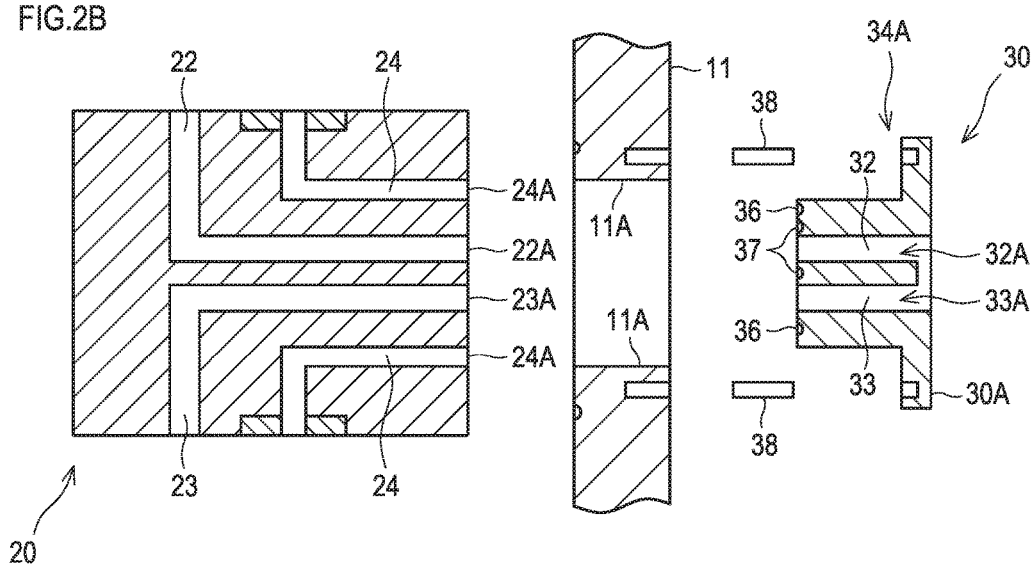
FIG. 2B is an exploded view, similarly.
Figure 3A:
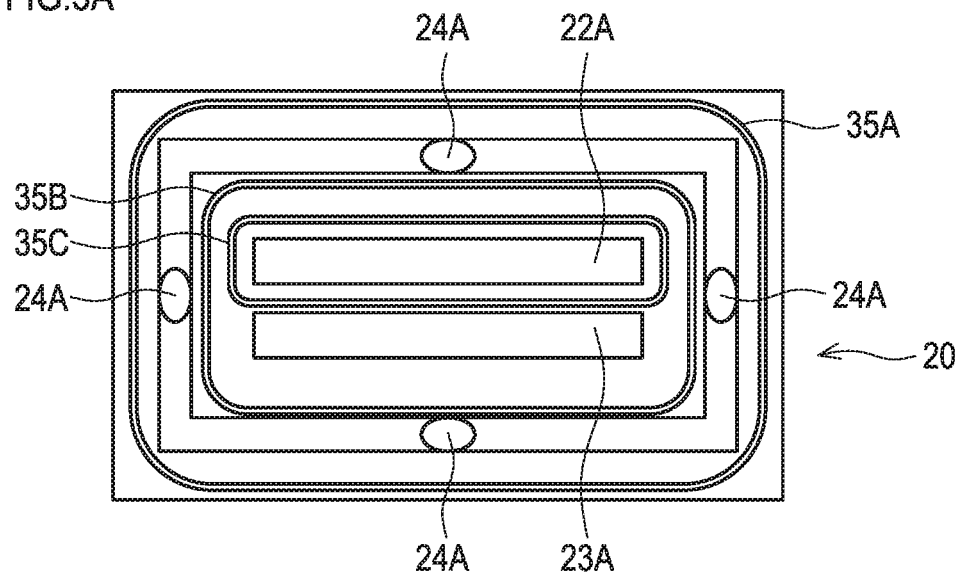
Figure 3B:
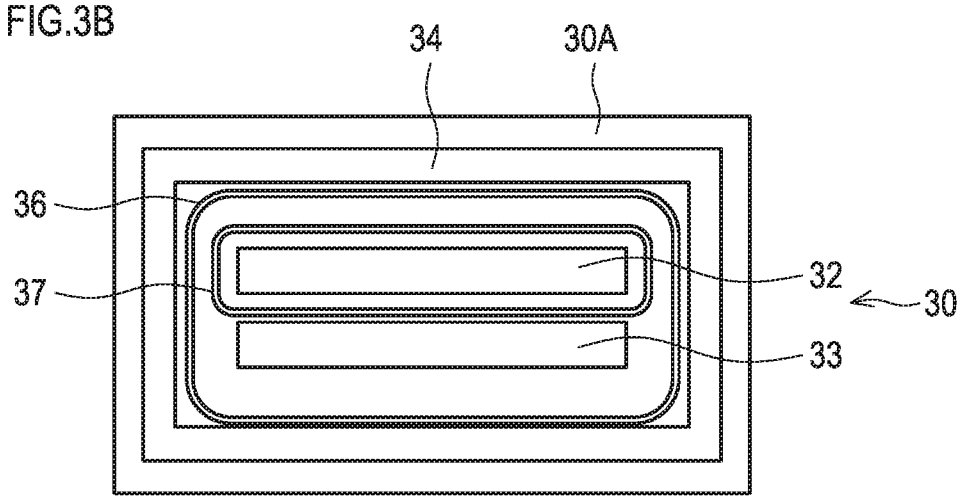
FIG. 3B is an end view of the injector adhesion preventive member, similarly.

Now, the injector 20 and the injector adhesion preventive member 30 will be described. The injector 20 and the injector adhesion preventive member 30 are installed to a tubular opening 11A of the film deposition chamber 11, and raw material gas and reactant gas are supplied into the film deposition chamber 11 from the outside of the film deposition chamber 11. FIGS. 2A and 2B each are an enlarged view of the injector 20 and the injector adhesion preventive member 30 as viewed from a side surface of the film deposition chamber parallel to the gas flow direction. The opening 11A is formed such that flow of gas of the injector 20 and the injector adhesion preventive member 30 is parallel to a surface of the substrate 13. That is, the device for atomic layer deposition of this embodiment is a laminar flow type device. However, as the present invention, the device for atomic layer deposition is not limited to the laminar flow type device.

As illustrated in FIGS. 2A and 2B, the injector 20 has a raw material gas supply path 22, and a reactant gas supply path 23. The raw material gas supply path 22 is equivalent to an injector raw material gas supply path of the present invention, and the reactant gas supply path 23 is equivalent to an injector reactant gas supply path of the present invention. On a leading end side of the injector 20, a raw material gas supply port 22A is formed on a leading end side of the raw material gas supply path 22, a reactant gas supply port 23A is formed on a leading end side of the reactant gas supply path 23. The raw material gas supply port 22A is equivalent to an injector raw material gas supply port of the present invention, and the reactant gas supply port 23A is equivalent to an injector reactant gas supply port of the present invention.

The raw material gas supply path 22 is also used as a supply path for purging raw material gas, and the reactant gas supply path 23 is also used as a supply path for purging reactant gas.

The raw material gas supply path 22 is opened in an outer peripheral surface of the injector 20, and has a square hole shape that changes the direction before an axis center to linearly extend to the film deposition chamber 11 side along the axial direction, as illustrated in FIGS. 2A and 2B.

The reactant gas supply path 23 is opened in an outer peripheral surface on another side of the injector 20, and has a square hole shape that changes the direction before the axis center to linearly extend to the film deposition chamber 11 side along the axial direction, as illustrated in FIGS. 2A and 2B. The raw material gas supply path 22 and the raw material gas supply port 22A, and the reactant gas supply path 23 and the reactant gas supply port 23A are partitioned by a wall section located between the raw material gas supply path 22 and the raw material gas supply port 22A, and the reactant gas supply path 23 and the reactant gas supply port 23A.

Four inert gas supply paths 24 are opened at positions of the film deposition chamber 11 side with respect to the openings of the raw material gas supply path 22 and the reactant gas supply path 23 in the outer peripheral surface of the injector 20 at equal angular intervals. The respective inert gas supply paths 24 extend toward the axis center, and changes the direction at the outside leading to the raw material gas supply path 22 and the reactant gas supply path 23 to linearly extend to the film deposition chamber 11 side along the axial directions at upper, lower, and both lateral positions of these gas supply paths. On the leading end side of the injector 20, inert gas supply ports 24A are formed in the respective inert gas supply paths 24.

The inert gas supply paths 24 are preferably provided at one or more places in the injector 20 as described above. For example, in a rectangular parallelepiped shape whose aspect ratio between the injector width and height is 10:1, raw material gas supply paths are preferably provided in at least two places, namely, an upper surface of the injector 20 and a lower surface of the injector 20, and preferably each have a shower head structure on the injector adhesion preventive member 30 side as described below. With the shower structure, gas can be more uniformly supplied into the film deposition chamber 11.

The inert gas supply paths 24 and the inert gas supply ports 24A are partitioned from the raw material gas supply path 22 and the raw material gas supply port 22A, and the reactant gas supply path 23 and the reactant gas supply port 23A by wall sections located between the inert gas supply paths 24 and the inert gas supply ports 24A, and the raw material gas supply path 22 and the raw material gas supply port 22A, and between the inert gas supply paths 24 and the inert gas supply ports 24A, and the reactant gas supply path 23 and the reactant gas supply port 23A.

The inert gas supply paths 24 are each equivalent to an injector inert gas supply path of the present invention, and the inert gas supply ports 24A are each equivalent to an injector inert gas supply port of the present invention.

Now, the injector adhesion preventive member 30 will be described.

The injector adhesion preventive member 30 has a tubular shape having a clearance between an inner peripheral surface of the opening 11A and the outer peripheral side of the injector adhesion preventive member 30 when the injector adhesion preventive member 30 is inserted into the opening 11A, and the injector adhesion preventive member 30 is disposed such that the leading end abuts on the leading end of the injector 20.

The injector adhesion preventive member 30 has a raw material gas supply path 32 communicated with the raw material gas supply port 22A, and a raw material gas supply port 32A is formed in a film deposition chamber side end of the raw material gas supply path 32.

Additionally, the injector adhesion preventive member 30 has a reactant gas supply path 33 communicated with the reactant gas supply port 23A, and a reactant gas supply port 33A is formed in a film deposition chamber side end of the reactant gas supply path 33. The raw material gas supply path 32 and the raw material gas supply port 32A, and the reactant gas supply path 33 and the reactant gas supply port 33A are partitioned by a wall section located between the raw material gas supply path 32 and the raw material gas supply port 32A, and the reactant gas supply path 33 and the reactant gas supply port 33A.

The raw material gas supply path 32 is equivalent to an adhesion preventive member raw material gas supply path of the present invention, and the raw material gas supply port 32A is equivalent to an adhesion preventive member raw material gas supply port of the present invention.

The reactant gas supply path 33 is equivalent to an adhesion preventive member reactant gas supply path of the present invention, and the reactant gas supply port 33A is equivalent to an adhesion preventive member reactant gas supply port of the present invention.

In this embodiment, a position of the wall section between the raw material gas supply path 32 and the reactant gas supply path 33 is located on the injector side with respect to a film deposition chamber side leading end of the injector adhesion preventive member 30, and therefore the raw material gas supply port 32A and the reactant gas supply port 33A are located on the injector side. The reason is because gas is expanded in the direction perpendicular to the flow direction at a position farther from the substrate as much as possible, and is uniformly supplied to the substrate 13.

However, the wall section between the raw material gas supply path 32 and the reactant gas supply path 33 of the adhesion preventive member is required. This is because a film is deposited on a portion near a film deposition position of the wall section. In a case where the wall section does not exist, a film is adhered to the injector of the raw material gas supply port 22A, and the reactant gas supply port 23A, and maintenance of the injector 20 is required. The wall section horizontal length is desirably 0 to 50 mm, and more desirably 30 mm.

The clearance between the injector adhesion preventive member 30 and the opening 11A is annular as described above, and forms an inert gas supply path 34. The inert gas supply ports 24A of the injector 20 are communicated with the inert gas supply path 34, and become a shower head structure. The inert gas supply path 34 is equivalent to an adhesion preventive member inert gas supply path of the present invention.

In a case where an annular flow path is provided only on the film deposition chamber 11 side in the injector adhesion preventive member 30, a flow path is desirably provided at one or more places on the injector side from the annular flow path similar to the inert gas supply paths 24.

An end on the inside of the film deposition chamber 11 of the injector adhesion preventive member 30 has a flange 30A whose size exceeds the side of the opening 11A, and the flange 30A is installed so as to have a clearance between the flange 30A and an inner surface of the film deposition chamber 11. The size of this clearance is desirably 10 mm or less. The lower limit of the clearance is not particularly limited, and any clearance allowing outflow of inert gas can be employed. In a case where members abut on each other as well, when the members have rough surfaces, gas outflow is obtained by clearances between the rough surfaces.

For example, an inner surface of the flange 30A can be intentionally made as a rough surface (for example, Ra (arithmetic mean roughness)=3 to 6 m), and the inner surface of the flange 30A can be installed so as to abut on an inner wall of the film deposition chamber 11.

The inert gas supply path 34 for allowing gas to flow is ensured by this rough surface shape. A clearance of at least 0.001 mm or more is desirably provided.

At this point, as the lower limit of the size of the clearance, 0.001 mm can be given as an example.

The above inert gas supply path 34 forms a part of this clearance, and an inert gas supply port 34A is formed in an outer peripheral end of the clearance. The inert gas supply port 34A is equivalent to an adhesion preventive member inert gas supply port of the present invention.

The raw material gas supply path 32 and the raw material gas supply port 32A, and the reactant gas supply path 33 and the reactant gas supply port 33A are partitioned from the inert gas supply path 34 and the inert gas supply port 34A by a wall section located between the raw material gas supply path 32 and the raw material gas supply port 32A, and the inert gas supply path 34 and the inert gas supply port 34A, and between the reactant gas supply path 33 and the reactant gas supply port 33A, and the inert gas supply path 34 and the inert gas supply port 34A.

The raw material gas supply path 32 is also used as a supply path for purging raw material gas, and the reactant gas supply path 33 is also used as a supply path for purging reactant gas.

Now, sealing portions between the injector 20 and the injector adhesion preventive member 30 will be described with reference to FIG. 2A, FIG. 2B, FIG. 3A, and FIG. 3B.

The leading end of the injector 20 and the leading end of the injector adhesion preventive member 30 abut on each other at a communication portion between the inert gas supply paths 24 and the inert gas supply path 34 through the inert gas supply ports 24A, at a communication portion between the raw material gas supply path 22 and the raw material gas supply path 32 through the raw material gas supply port 22A, and a communication portion between the reactant gas supply path 23 and the reactant gas supply path 33 through the reactant gas supply port 23A.

The injector 20 has a larger tubular shape than the opening 11A, the leading end is annularly in contact with an outer wall of the film deposition chamber 11 on the outside of the opening 11A, and an O-ring 35A is disposed as a sealing member between the injector 20 and the outer wall of the film deposition chamber 11, and is installed on a film deposition device 11 by a fixture (not illustrated).

Screw holes are formed respectively in the inner surface of the flange 30A of the injector adhesion preventive member 30 and in an inner wall surface near the opening 11A, and screws 38 are disposed between the inner surface of the flange 30A of the injector adhesion preventive member 30 and the inner wall surface near the opening 11A, thereby the injector adhesion preventive member 30 is fixed to the film deposition chamber 11 while a clearance are ensured between each of the inner surfaces. A distance between the flange 30A of the injector adhesion preventive member 30 and an inner wall of the film deposition chamber 11 near the opening 11A is set to, for example, 0.1 mm. The above distance can be adjusted by utilizing shims in the screw portions, for example, and fixing can be performed without using the shims.

In the injector 20 and the injector adhesion preventive member 30, an O-ring 35B is disposed as a sealing member, on inner diameter sides of the inert gas supply paths 24, 34 and an on outer diameter sides of the raw material gas supply paths 22, 32, and the reactant gas supply paths 23, 33, in the above abutting surfaces. In the injector adhesion preventive member 30, an O-ring groove 36 for storing a part of a sectional shape of the O-ring 35B is annularly formed so as to match a placement position of the O-ring 35B.

Additionally, an O-ring 35C is disposed at such a position that the raw material gas supply paths 22, 32 are surrounded so as to be located on the abutting surfaces between the raw material gas supply paths 22, 32 and the reactant gas supply paths 23, 33, on the inner diameter side of the placement position of the O-ring 35B. In the injector adhesion preventive member 30, an O-ring groove 37 for storing a part of a sectional shape of the O-ring 35C is annularly formed so as to match a placement position of the O-ring 35C.

When the injector adhesion preventive member 30 is installed to the film deposition device 11 by the screws 38, the injector adhesion preventive member 30 is pushed toward the injector 20 side, so that each O-ring is pressed, and a sealing property is improved.

Each O-ring reliably partitions a supply path and a supply port.

The reason why the O-ring grooves 36, 37 are provided in the injector adhesion preventive member 30 is because the O-rings 35B, 35C are simultaneously pulled out to be replaced when the injector adhesion preventive member 30 is pulled out from the inside of the film deposition chamber 11 at the time of maintenance. In a case where the O-ring groove is provided in the injector 20, the injector 20 needs to be separated from the film deposition chamber 11 at the time of maintenance, and maintainability is lowered.

With the above configuration, raw material gas supplied to the raw material gas supply path 22 passes through the raw material gas supply port 22A, the raw material gas supply path 32, and the raw material gas supply port 32A to be supplied into the film deposition chamber 11. Purge gas that purges the raw material gas passes similarly.

Reactant gas supplied from the reactant gas supply path 23 passes through the reactant gas supply port 23A, the reactant gas supply path 33, and the reactant gas supply port 33A to be supplied into the film deposition chamber 11. Purge gas that purges the reactant gas passes similarly.

Inert gas supplied from the inert gas supply paths 24 passes through the inert gas supply ports 24A, the inert gas supply path 34, and the inert gas supply port 34A to be supplied into the film deposition chamber 11.

The raw material gas, the reactant gas, the purge gas, the inert gas supplied into the film deposition chamber 11 are exhausted from the exhaust section 40.

In the above configuration, a position where raw material gas and reactant gas are mixed is inside the injector adhesion preventive member 30, and therefore the raw material gas and the reactant gas react inside the injector 20, and film adhesion can be suppressed.

The opening 11A that introduces the injector adhesion preventive member 30, and the injector adhesion preventive member 30 can be reliably partitioned by the O-ring 35B, and it is possible to suppress amounts of raw material gas and reactant gas that leak to the inert gas supply ports 24A and the inert gas supply port 34A.

The opening 11A that introduces the injector adhesion preventive member 30, and the injector adhesion preventive member 30 can be reliably partitioned by the O-ring 35C, and it is possible to suppress entry of the raw material gas from the raw material gas supply path 22 to the reactant gas supply paths 23, 33, and entry of the reactant gas from the reactant gas supply path 23 to the raw material gas supply paths 22, 32.

Diffusion entry of the raw material gas and the reactant gas from the inside of the film deposition chamber 11 can be suppressed by supply of the inert gas from the inert gas supply paths 24, 34 to the inert gas supply ports 24A, 34A. The inert gas is, for example, nitrogen or argon.

Now, a processing procedure in the above device for atomic layer deposition 10 will be described.

Figure 4:
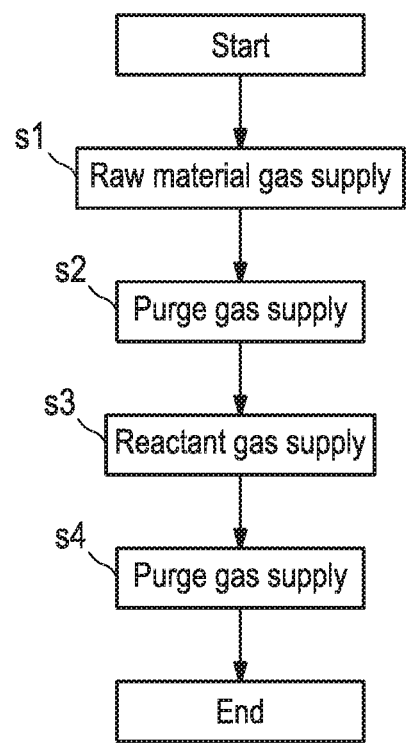
FIG. 4 A flowchart illustrating an example of an atomic layer deposition method similarly.

FIG. 4 is a flowchart illustrating an example of an atomic layer deposition method of this embodiment. FIGS. 5A to 5D each are a view illustrating a process of forming a thin film on a substrate S.

Figure 5A:
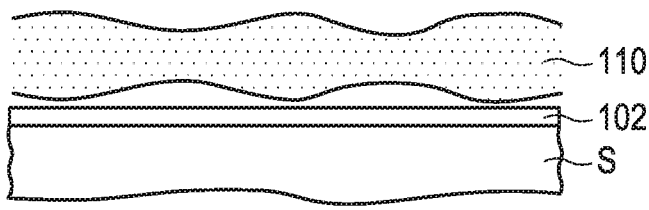

First, a raw material gas supply section supplies raw material gas into the film deposition chamber 11 (Step s1). More specifically, the raw material gas supply section supplies raw material gas to the raw material gas supply path 22 (Step s1). The raw material gas passes through the raw material gas supply path 22, the raw material gas supply port 22A, the raw material gas supply path 32, and the raw material gas supply port 32A to be supplied into the film deposition chamber 11. The raw material gas is supplied into the film deposition chamber 11 for, for example, 0.1 seconds. As illustrated in FIG. 5A, raw material gas 110 is supplied into the film deposition chamber 11 through Step s1, and the raw material gas 110 is adsorbed on the substrate S, so that an adsorption layer 102 is formed.

In Step s1, inert gas is supplied to an inner surface of the injector 20 and an outer surface of the injector adhesion preventive member 30. More specifically, the inert gas is supplied to the inert gas supply paths 24. The inert gas passes through the inert gas supply paths 24, the inert gas supply ports 24A, the inert gas supply path 34, and the inert gas supply port 34A to be supplied into the film deposition chamber 11.

In this embodiment, not only in Step s1, but also in Steps s2 to s4 described below, the inert gas is always supplied through the inert gas supply paths 24 and the like. Therefore, in Step s1, when the raw material gas is supplied into the film deposition chamber 11 through the raw material gas supply path 22 and the like, it is possible to suppress entry of the raw material gas into a clearance between the film deposition chamber 11 and the injector 20 and a clearance between the film deposition chamber 11 and the injector adhesion preventive member 30.

In Step s1, purge gas can be made to flow from the reactant gas supply path 23. It is possible to suppress movement of the raw material gas to the reactant gas supply port 33A by diffusion, and film adhesion to the reactant gas supply port 23A.

Next, the supply of the raw material gas is stopped, and purge gas is supplied to the raw material gas supply path 22 (Step s2). The purge gas passes through the raw material gas supply path 22, the raw material gas supply port 22A, the raw material gas supply path 32, and the raw material gas supply port 32A to be supplied into the film deposition chamber 11. The raw material gas is exhausted from the exhaust section 40 to the outside of the film deposition chamber 11.

Figure 5B:
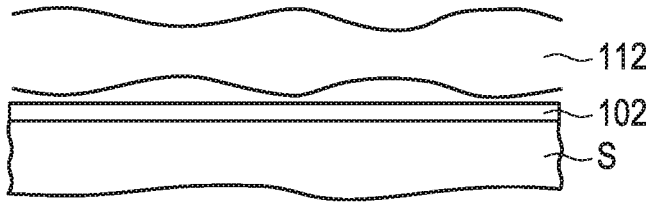

The purge gas is supplied into the film deposition chamber 11 for, for example, 0.1 seconds. The exhaust section 40 exhausts the raw material gas 110 and purge gas 112 in the film deposition chamber 11. The exhaust section 40 exhausts the raw material gas 110 and the purge gas 112 in the film deposition chamber 11 for, for example, 2 seconds. As illustrated in FIG. 5B, through Step s2, the purge gas 112 is supplied into the film deposition chamber 11, and the raw material gas 110 that is not adsorbed on the substrate S is purged from the film deposition chamber 11.

Figure 5C:
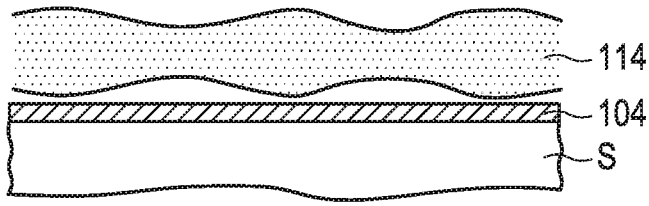

Next, reactant gas is supplied into the film deposition chamber 11 (Step s3). More specifically, the reactant gas is supplied to the reactant gas supply path 23 (Step s3). The reactant gas passes through the reactant gas supply path 23, the reactant gas supply port 23A, the reactant gas supply path 33, and the reactant gas supply port 33A to be supplied into the film deposition chamber 11. The reactant gas is supplied into the film deposition chamber 11 for, for example, 1 second. As illustrated in FIG. 5C, reactant gas 114 is supplied into the film deposition chamber 11 through Step s3.

Also in Step s3, inert gas is supplied to the inner surface of the injector 20 and the outer surface of the injector adhesion preventive member 30 through the inert gas supply paths 24 and the like. Therefore, in Step s3, when reactant gas is supplied into the film deposition chamber 11 through the reactant gas supply path 23 and the like, it is possible to suppress entry of the reactant gas into the clearance between the film deposition chamber 11 and the injector 20 and the clearance between the film deposition chamber 11 and the injector adhesion preventive member 30.

In Step s3, purge gas can be made to flow from the raw material gas supply path 22. It is possible to suppress movement of the reactant gas to the raw material gas supply port 32A by diffusion, and film adhesion to the raw material gas supply port 22A.

Figure 5D:
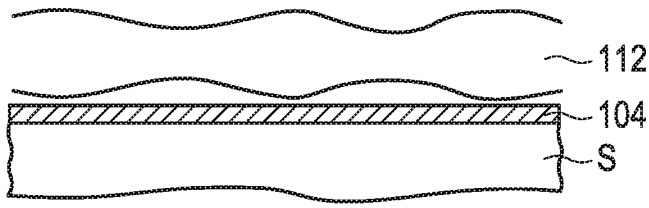

Next, the supply of the reactant gas is stopped, and purge gas is supplied to the reactant gas supply path 23 (Step s4). The purge gas passes through the reactant gas supply path 23, the reactant gas supply port 23A, the reactant gas supply path 33, and the reactant gas supply port 33A to be supplied into the film deposition chamber 11. The purge gas is exhausted from the exhaust section 40 to the outside of the film deposition chamber 11. The purge gas is supplied into the film deposition chamber 11 for, for example, 0.1 seconds. The exhaust section 40 exhausts the reactant gas 114 and the purge gas 112 in the film deposition chamber 11. As illustrated in FIG. 5D, through Step s4, the purge gas 112 is supplied into the film deposition chamber 11, and the reactant gas 114 is purged from the film deposition chamber 11.

Through Steps s1 to s4 described above, a thin film layer 104 which is an atomic layer is formed on the substrate S. Hereinafter, Steps s1 to s4 are repeated a predetermined number of times, so that it is possible to form the thin film layer 104 having a desired film thickness.

In the device for atomic layer deposition 10 of this embodiment, the inert gas flows through the inner surface of the injector 20 and the outer surface of the injector adhesion preventive member 30, and therefore it is possible to suppress entry of the raw material gas and the reactant gas into the clearance between the film deposition chamber 11 and the injector 20. Therefore, it is possible to suppress adhesion of the thin film to the clearance between the film deposition chamber 11 and the injector 20.

Additionally, for example, gas etching can be performed using $BCl_3$ gas on an alumina film formed by using TMA as the raw material gas and $O_3$ as the reactant gas. In order to perform gas etching of the alumina film by $BCl_3$ gas, for example, heating to a high temperature of about 500 C is required.

The inner wall of the film deposition chamber 11 located in the vicinity of the heater 14A can be heated to a high temperature of about 500 C by the heater 14A. Therefore, the thin film adhered on the inner wall of the film deposition chamber 11 located in the vicinity of the heater 14A can be removed by gas etching.

As described above, according to this embodiment, it is possible to suppress adhesion of the thin film on the inner wall of the film deposition chamber 11, and the thin film adhered on the inner wall can be removed by gas etching, and therefore it is possible to reduce the frequency of cleaning by wet etching.

EXAMPLE 1

An AlON thin film was formed on a G2 glass substrate of 370 mm 470 mm by using the film deposition chamber 11 of Embodiment 1. TMA (trimethylaluminum) was used as a liquid raw material (Al source), and oxygen plasma and nitrogen plasma were used as the reactant gas. The sequence illustrated in FIG. 4 was employed for the film deposition. The flow rate of the inert gas was set to 200 sccm (80 C), and the inert gas was always supplied during the film deposition sequence.

After deposition of a film of 20 m was performed, the film thicknesses of all parts of the injector adhesion preventive member 30 and the injector 20 corresponding to the inert gas supply ports 24A, 34A were visually observed. An interference film of an AlON thin film which is visually observable was not observed, and it was confirmed that the deposition amount was 50 nm or less. The maintenance of the gas supply ports was only maintenance for the injector adhesion preventive member 30 and the screws 38, and the injector 20 and the opening 11A can be made maintenance-free.

Thus, the present invention was described on the basis of the above embodiment. However, suitable change of this embodiment can be made without departing from the scope of the invention.

This application claims priority based on Japanese Patent Application No. 2015-106855 filed in Japan on May 26, 2015, the entirety of which is incorporated herein by reference.

REFERENCE SIGNS LIST 10 device for atomic layer deposition
11 film deposition chamber 13 substrate
14 stage
14A heater
15 high frequency power supply
20 injector
22 raw material gas supply path
22A raw material gas supply port
23 reactant gas supply path
23A reactant gas supply port
24 inert gas supply path
24A inert gas supply port
30 injector adhesion preventive member
32 raw material gas supply path
32A raw material gas supply port
33 reactant gas supply path
33A reactant gas supply port
34 inert gas supply path
34A inert gas supply port
35A O-ring
35B O-ring
35C O-ring
36 O-ring groove
37 O-ring groove
40 exhaust section
S substrate
102 adsorption layer
104 thin film layer
110 raw material gas
112 purge gas
114 reactant gas

The invention claimed is:

1. A device for atomic layer deposition comprising:
a film deposition chamber;
an injector that is installable to an opening of the film deposition chamber; and
an injector adhesion preventive member that is installable by insertion into the opening so as to be located on an inside of the film deposition chamber than the injector, wherein:
the injector includes:
an injector raw material gas supply path for supplying raw material gas as a raw material of a thin film, and an injector raw material gas supply port that is provided in the injector raw material gas supply path that the raw material gas flows out;
an injector reactant gas supply path for supplying reactant gas which reacts with the raw material gas to form the thin film, and an injector reactant gas supply port that is provided in the injector reactant gas supply path that the reactant gas flows out; and
an injector inert gas supply path that an inert gas flows, and an injector inert gas supply port that is provided in the injector inert gas supply path that the inert gas flows out, the respective paths and ports being partitioned from each other,
the injector adhesion preventive member includes:
an adhesion preventive member raw material gas supply path that is continued to the injector raw material gas supply port to supply the raw material gas, and an adhesion preventive member raw material gas supply port that is provided in the adhesion preventive member raw material gas supply path that the raw material gas flows out to the inside of the film deposition chamber;
an adhesion preventive member reactant gas supply path that is continued to the injector reactant gas supply port to supply the reactant gas, and an adhesion preventive member reactant gas supply port that is provided in the adhesion preventive member reactant gas supply path that the reactant gas flows out to the inside of the film deposition chamber; and
an adhesion preventive member inert gas supply path that is continued to the injector inert gas supply port to send the inert gas, and an adhesion preventive member inert gas supply port that is provided in the adhesion preventive member inert gas supply path that the inert gas flows out to the inside of the film deposition chamber, the respective paths and ports being partitioned from each other, and
the adhesion preventive member inert gas supply path is provided such that the inert gas flows in a clearance between an outer peripheral side of the injector adhesion preventive member and an inner peripheral side of the opening.

2. The device for atomic layer deposition according to claim 1, wherein in the injector and the injector adhesion preventive member, sealing members are disposed in at least such positions as to partition the raw material gas and the reactant gas, between members that communicate the injector raw material gas supply path with the adhesion preventive member raw material gas supply path through the injector raw material gas supply port, and between members that communicate the injector reactant gas supply path with the adhesion preventive member reactant gas supply path through the injector reactant gas supply port.

3. The device for atomic layer deposition according to claim 2, wherein a leading end of the injector and a leading end of the injector adhesion preventive member are disposed so as to abut on each other, and the sealing members are pressed in a state where the injector adhesion preventive member is installed to the film deposition chamber.

4. The device for atomic layer deposition according to claim 2, wherein the sealing members are O-rings.

5. The device for atomic layer deposition according to claim 4, wherein in the injector adhesion preventive member, an O-ring groove that stores a part of a sectional shape of the O-ring is formed.

6. The device for atomic layer deposition according to claim 2, wherein a sealing member is disposed on a contact surface of the film deposition chamber and the injector.

7. The device for atomic layer deposition according to claim 1, wherein the adhesion preventive member inert gas supply path is formed by a space between an outer wall of the injector adhesion preventive member and an inside of an inner wall of the opening.

8. The device for atomic layer deposition according to claim 1, wherein the injector adhesion preventive member has a flange whose size exceeds a size of the opening on a side of the film deposition chamber, the flange has a clearance between the inner wall of the film deposition chamber adjacent to the opening and the flange, and the clearance is provided with the adhesion preventive member inert gas supply port.

9. The device for atomic layer deposition according to claim 8, wherein a size of the clearance is 10 mm or less.

10. The device for atomic layer deposition according to claim 8, wherein the flange is installed to the film deposition chamber by a installing member capable of adjusting the clearance.

11. The device for atomic layer deposition according to claim 1, wherein the opening is formed in a tubular hole shape, and the injector raw material gas supply path and the injector reactant gas supply path located on at least a side of the film deposition chamber of the injector, and the adhesion preventive member raw material gas supply path and the adhesion preventive member reactant gas supply path of the injector adhesion preventive member, are formed along an axial direction of the opening.

12. The device for atomic layer deposition according to claim 1, further comprising respective purge gas supply paths that purges the raw material gas and the reactant gas.

13. The device for atomic layer deposition according to claim 12, wherein:
   the purge gas supply path that purges the raw material gas that serves something as an injector raw material gas supply path and an adhesion preventive member raw material gas supply path, and
   the purge gas supply path that purges the reactant gas that serves something as an injector reactant gas supply path and an adhesion preventive member reactant gas supply path.

14. The device for atomic layer deposition according to claim 1, wherein the adhesion preventive member inert gas supply path is formed as an annular flow path formed in at least an end on a side of the film deposition chamber, and the injector inert gas supply path has a plurality of linear flow paths toward the film deposition chamber, and is communicated with the annular flow path.

15. The device for atomic layer deposition according to claim 1, wherein the adhesion preventive member raw material gas supply port and the adhesion preventive member reactant gas supply port are located on a side of the injector than an inner end surface of the adhesion preventive member on a side of the film deposition chamber.

16. The device for atomic layer deposition according to claim 4, wherein a sealing member is disposed on a contact surface of the film deposition chamber and the injector.

* * * * *